(12) United States Patent
Hirose et al.

(10) Patent No.: US 7,800,097 B2
(45) Date of Patent: Sep. 21, 2010

(54) SEMICONDUCTOR DEVICE INCLUDING INDEPENDENT ACTIVE LAYERS AND METHOD FOR FABRICATING THE SAME

(75) Inventors: Yutaka Hirose, Kyoto (JP); Tsuyoshi Tanaka, Osaka (JP)

(73) Assignee: Panasonic Corporation, Osaka (JP)

( * ) Notice: Subject to any disclaimer, the term of this patent is extended or adjusted under 35 U.S.C. 154(b) by 27 days.

(21) Appl. No.: 11/299,818

(22) Filed: Dec. 13, 2005

(65) Prior Publication Data

US 2006/0124960 A1 Jun. 15, 2006

(30) Foreign Application Priority Data

Dec. 13, 2004 (JP) .............................. 2004-359447

(51) Int. Cl.
*H01L 21/00* (2006.01)
*H01L 29/06* (2006.01)
*H01L 31/072* (2006.01)

(52) U.S. Cl. .......................... 257/20; 257/11; 257/189; 257/E21.403; 257/E21.407; 438/48

(58) Field of Classification Search ................. 257/196, 257/183, 194, E21.403, E21.407, E21.395, 257/E21.399, 189, 20, 797, 192, 201, 121, 257/126, 128, 494, 495, 11

See application file for complete search history.

(56) References Cited

U.S. PATENT DOCUMENTS

| | | | | |
|---|---|---|---|---|
| 5,068,756 A | * | 11/1991 | Morris et al. | ................ 257/192 |
| 5,243,207 A | * | 9/1993 | Plumton et al. | ............. 257/192 |
| 5,289,015 A | * | 2/1994 | Chirovsky et al. | ............. 257/21 |
| 5,536,953 A | * | 7/1996 | Dreifus et al. | ................. 257/77 |
| 5,606,184 A | * | 2/1997 | Abrokwah et al. | .......... 257/192 |
| 5,912,479 A | * | 6/1999 | Mori et al. | .................... 257/192 |
| 6,140,690 A | * | 10/2000 | Oka et al. | .................... 257/494 |
| 6,618,418 B2 | * | 9/2003 | Northrup et al. | ......... 372/46.01 |
| 6,724,019 B2 | * | 4/2004 | Oda et al. | .................... 257/195 |
| 6,825,559 B2 | | 11/2004 | Mishra et al. | |
| 2003/0160265 A1 | * | 8/2003 | Inoue et al. | ................. 257/189 |
| 2004/0099888 A1 | * | 5/2004 | Sriram | ........................ 257/288 |
| 2006/0091430 A1 | * | 5/2006 | Sriram et al. | ............... 257/280 |
| 2006/0226415 A1 | * | 10/2006 | Nishijima et al. | ............. 257/11 |

FOREIGN PATENT DOCUMENTS

| JP | 06-246471 | | 9/1994 |
|---|---|---|---|
| JP | 09-223819 | | 8/1997 |
| JP | 09-246471 | | 9/1997 |
| JP | 09246471 A | * | 9/1997 |
| JP | 2996169 | | 10/1999 |
| JP | 3409958 | | 3/2003 |

\* cited by examiner

*Primary Examiner*—Wael M Fahmy
*Assistant Examiner*—Sarah K Salerno
(74) *Attorney, Agent, or Firm*—McDermott Will & Emery LLP

(57) ABSTRACT

A semiconductor device includes a semiconductor substrate of n-type silicon including, in an upper portion thereof, a first polarity inversion region and a second polarity inversion regions spaced from each other and doped with a p-type impurity. A first HFET including a first active layer and a second HFET including a second active layer both made of a group III-V nitride semiconductor are independently formed on the respective polarity inversion regions in the semiconductor substrate, and the HFETs are electrically connected to each other through interconnects.

24 Claims, 9 Drawing Sheets

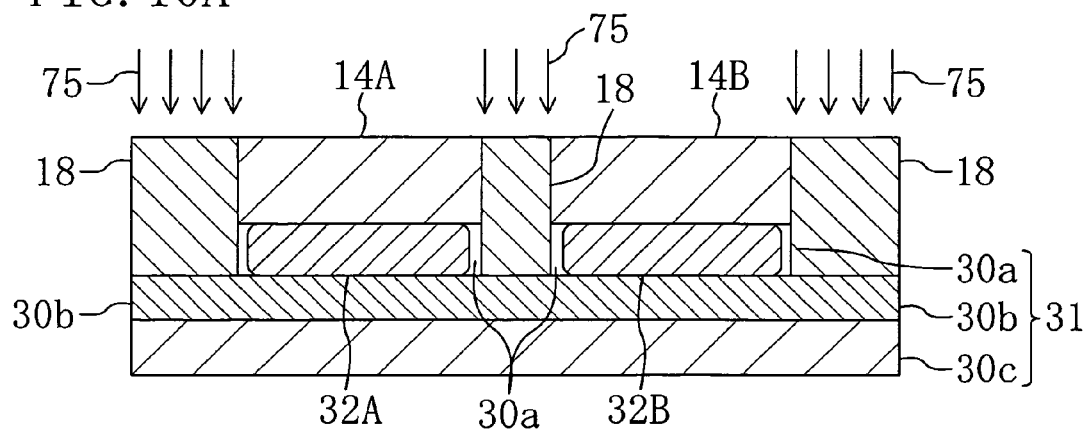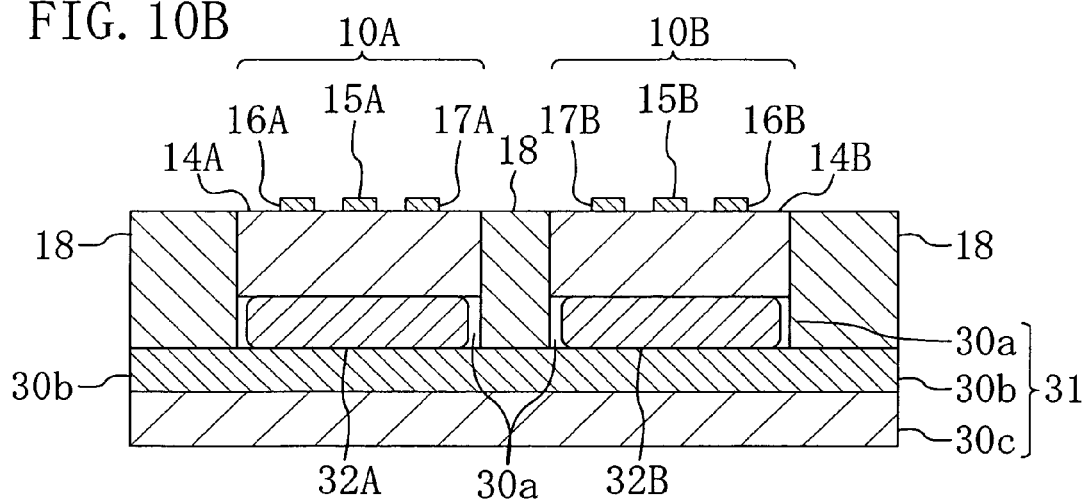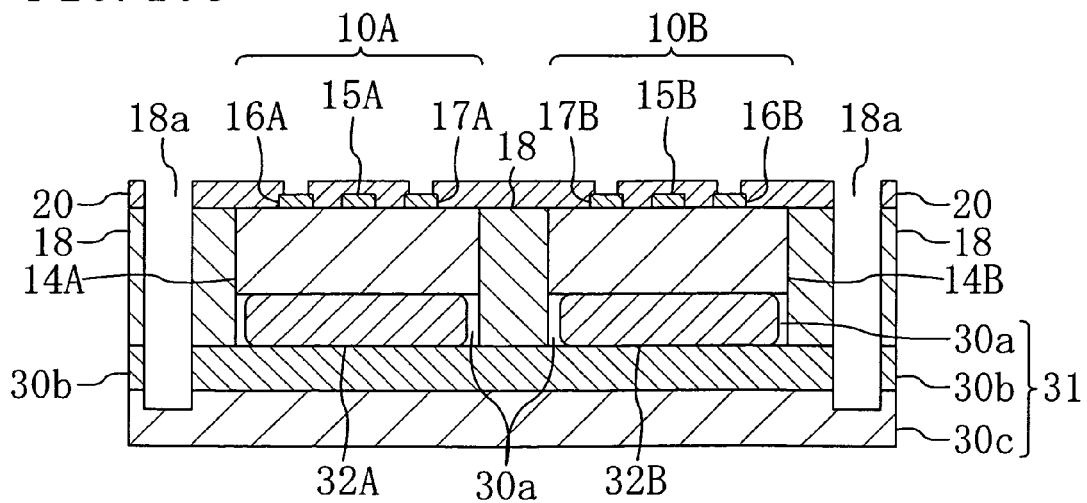

SEMICONDUCTOR DEVICE INCLUDING INDEPENDENT ACTIVE LAYERS AND METHOD FOR FABRICATING THE SAME

CROSS-REFERENCE TO RELATED APPLICATIONS

This application claims priority under 35 U.S.C. §119 on Patent Application No. 2004-359447 filed in Japan respectively on Dec. 13, 2004, the entire content of which is hereby incorporated by reference.

BACKGROUND OF THE INVENTION

The present invention relates to a semiconductor device and a method for fabricating the same, and more particularly it relates to a semiconductor device including a plurality of high power elements using a group III-V nitride semiconductor.

A group III-V nitride semiconductor is a compound semiconductor of a compound composed of aluminum (Al), boron (B), gallium (Ga) or indium (In) and nitride (N) represented by a general formula of $B_w Al_x Ga_y In_z N$ (wherein w+x+y+z=1 and $0 \leq w, x, y, z \leq 1$).

A group III-V nitride semiconductor has various advantages such as a large band gap, a high breakdown voltage derived from the large band gap, a high electron saturation velocity and high electron mobility, and a high electron concentration attained in forming a heterojunction, and therefore, various examinations and developments are now being made on application to a short-wavelength light emitting device, a high power high-frequency device, a high-frequency low-noise amplifier device, a high power switching device and the like.

Conventionally, such devices are developed as simplex devices for attaining performances that are realized by utilizing good material characteristics (physical properties) of a group III-V nitride semiconductor itself but cannot be realized by using other materials.

FIG. 11 is a cross-sectional view of a conventional group III-V nitride semiconductor device using a heterojunction (see, for example, Japanese Patent Publication No. 2996169 or 3409958). As shown in FIG. 11, the conventional group III-V nitride semiconductor device includes an operation layer 102 of gallium nitride (GaN) and a barrier layer 103 of aluminum gallium nitride (AlGaN) successively stacked on a semiconductor substrate 101 with a conducting property, and a heterojunction is formed on an interface between the operation layer 102 and the barrier layer 103 having different band gaps.

The barrier layer 103 is partitioned by an insulating isolation region 104 reaching an upper portion of the operation layer 102, a Schottky gate electrode 105 is formed on the partitioned barrier layer 103, and an ohmic source electrode 106 and an ohmic drain electrode 107 are formed on both sides of the gate electrode 105 along the gate length direction. Thus, the semiconductor device is operated as a heterojunction field effect transistor (hereinafter referred to as the HFET).

In the vicinity of the interface in the operation layer 102 of the heterojunction between the operation layer 102 and the barrier layer 103, electrons derived from a difference in spontaneous polarization and piezo-electric polarization between the operation layer 102 and the barrier layer 103, an n-type impurity doped in the barrier layer 103 and other uncontrollable defects caused in the operation layer 102 and the barrier layer 103 are accumulated in a high concentration so as to form a two-dimensional electron gas (2DEG), and the thus formed 2DEG works as a channel carrier of the field effect transistor.

The source electrode 106 is electrically connected to the semiconductor substrate 101 set to ground potential through a surface via interconnect 108, so as to reduce a parasitic component in a high-frequency or high-speed switching operation. Also, the semiconductor substrate 101 set to the ground potential functions also as a field plate (field releasing plate), and therefore, it exhibits an effect to release concentration of the electric field in a device active region, and particularly at an end of the gate electrode 105 closer to the drain electrode 107.

In the conventional group III-V nitride semiconductor device, however, current leakage is caused through the semiconductor substrate 101 in a high voltage operation, and therefore, it is difficult to electrically connecting or integrating a plurality of elements (HFETs) formed on one semiconductor substrate 101.

SUMMARY OF THE INVENTION

The present invention was devised for overcoming the aforementioned conventional problem, and an object of the invention is integrating a plurality of elements made of a group III-V nitride semiconductor on a semiconductor substrate with a conducting property.

In order to achieve the object, in the semiconductor device according to the invention, a plurality of semiconductor elements each having an active layer made of a group III-V nitride semiconductor are formed on polarity inversion regions with a polarity different from the conductivity type of a semiconductor substrate or on a semiconductor substrate having a buried insulating layer.

The first semiconductor device of this invention includes a semiconductor substrate of a first conductivity type having, in an upper portion thereof, a plurality of polarity inversion regions spaced from one another and formed by introducing an impurity of a second conductivity type; a plurality of semiconductor elements selectively formed respectively on the polarity inversion regions and respectively including independent active layers made of a group III-V nitride semiconductor; and interconnects for electrically connecting the semiconductor elements to one another.

In the first semiconductor device, semiconductor elements are electrically insulated from each other even within the semiconductor substrate owing to a depletion layer formed by a pn junction between each polarity inversion region and the semiconductor substrate. Therefore, even when the respective semiconductor elements are electrically connected to one another through interconnects and operated at a high voltage, a leakage current caused between the semiconductor elements through the semiconductor substrate can be suppressed to be very small. Accordingly, a semiconductor device including a plurality of semiconductor elements respectively having independent active layers made of a group III-V nitride semiconductor and electrically connected to one another can be integrated on a semiconductor substrate with a conducting property.

In the first semiconductor device, each of the semiconductor elements preferably has at least one terminal, and at least one of the semiconductor elements is preferably electrically connected to the semiconductor substrate at the terminal. Thus, the semiconductor substrate connected to one terminal of the semiconductor element functions as a field plate for releasing the electric field, and therefore, a higher breakdown voltage can be attained. Furthermore, since the semiconductor substrate has the same potential with respect to the plural semiconductor elements, if the semiconductor substrate is connected to a terminal for supplying common potential to the semiconductor elements, such as ground potential, a ground interconnect can be reduced.

In the first semiconductor device, preferably, the first conductivity type is p-type, the second conductivity type is n-type, and the III-V group nitride semiconductor includes an n-type layer. Accordingly, the positive source voltage applied at operation of the active layer made of the n-type III-V group nitride semiconductor forms a depletion layer at the interface of the p-n junction between each p-type polarity inversion region and the n-type active layer, thereby realizing higher breakdown voltage and smaller leakage current.

In the first semiconductor device, a concentration of the impurity in each of the polarity inversion regions is preferably lower in a peripheral portion thereof than in an inner portion thereof on a principal face of the semiconductor substrate. Thus, a breakdown voltage between the polarity inversion region and another region becomes higher, and hence, the semiconductor device can be operated at a higher voltage.

The first semiconductor device preferably further includes insulating isolation regions formed in the semiconductor substrate between the polarity inversion regions. Thus, a breakdown voltage between the polarity inversion region and another region becomes higher, the semiconductor device can be operated at a higher voltage.

In the first semiconductor device, a mark for identifying a position of each of the polarity inversion regions is preferably formed in the semiconductor substrate. Thus, after forming the semiconductor layer including the active layers made of the group III-V nitride semiconductor, alignment between the semiconductor layer and each polarity inversion region is eased.

In this case, the mark is preferably exposed on the semiconductor substrate.

The first method for fabricating a semiconductor device of this invention includes the steps of forming, in an upper portion of a semiconductor substrate of a first conductivity type, a plurality of polarity inversion regions spaced from one another by selectively introducing a first impurity of a second conductivity type into the semiconductor substrate; forming a semiconductor layer made of a group III-V nitride over the semiconductor substrate including the polarity inversion regions; forming insulating isolation regions extending from the semiconductor layer to the semiconductor substrate by selectively introducing a second impurity into portions of the semiconductor layer and the semiconductor substrate disposed around the polarity inversion regions, whereby respectively forming, on the polarity inversion regions, a plurality of element forming regions each including an active layer in the semiconductor layer; forming a plurality of semiconductor elements by forming electrodes on the element forming regions; and forming interconnects for electrically connecting the semiconductor elements to one another on the plurality of semiconductor elements.

In the first method for fabricating a semiconductor device, semiconductor elements are electrically insulated from each other even within the semiconductor substrate owing to a depletion layer formed by a pn junction between each polarity inversion region and the semiconductor substrate. Therefore, even when the respective semiconductor elements are electrically connected to one another through interconnects and operated at a high voltage, a leakage current caused between the semiconductor elements through the semiconductor substrate can be suppressed to be very small.

The first method for fabricating a semiconductor device preferably further includes, before the step of forming a semiconductor layer made of a group III-V nitride, a step of forming, in the semiconductor substrate, a mark for identifying a position of each of the polarity inversion regions, and the mark is preferably used for identifying the position of each of the polarity inversion regions in the semiconductor substrate in selectively forming the isolation regions between the polarity inversion regions in forming the plurality of element forming regions. Thus, after forming the semiconductor layer including the active layers made of the group III-V nitride semiconductor, alignment between each element forming region of the semiconductor layer and each polarity inversion region is eased.

The second semiconductor device of the invention includes a semiconductor substrate having buried insulating layers formed, from a principal face thereof toward an inner portion thereof, to be spaced from one another; a plurality of semiconductor elements formed to be spaced from one another on the semiconductor substrate and respectively including independent active layers made of a group III-V nitride semiconductor; and interconnects for electrically connecting the semiconductor elements to one another.

In the second semiconductor device, even semiconductor elements are electrically connected to each other as an integrated circuit on a semiconductor substrate having a buried insulating layer, a high voltage operation can be performed.

In the second semiconductor device, each of the semiconductor elements preferably has at least one terminal, and at least one of the semiconductor elements is preferably electrically connected to a portion above the buried insulating layer of the semiconductor substrate at the terminal. Thus, the semiconductor layer disposed above the buried insulating layer attains the same potential as the terminal of the semiconductor element so as to function as a field plate, and therefore, even when the semiconductor elements are electrically connected to one another, the semiconductor device can be operated at a higher voltage.

In the second semiconductor device, wherein each of the semiconductor elements preferably has at least one terminal, and at least one of the semiconductor elements is preferably electrically connected to a portion underneath the buried insulating layer of the semiconductor substrate at the terminal. Thus, potential of the semiconductor layer disposed below the buried insulating layer of the semiconductor substrate can be the same, and therefore, interconnect resistance can be reduced. In addition, since the semiconductor layer disposed below the buried insulating layer functions as a field plate, even when the semiconductor elements are electrically connected to one another, the semiconductor device can be operated at a higher voltage.

The second semiconductor device preferably further includes an insulating isolation region formed in the semiconductor substrate around the semiconductor elements. Thus, the breakdown voltage between the semiconductor elements can be increased, and hence, the semiconductor device can be operated at a higher voltage.

The second method for fabricating a semiconductor device of this invention includes the steps of forming a semiconductor layer made of a group III-V nitride on a conducting semiconductor substrate that includes buried insulating layers formed, from a principal face thereof toward an inner portion thereof, to be spaced from one another; forming insulating isolation regions extending to the buried insulating layers by selectively introducing an impurity into the semiconductor layer and the semiconductor substrate, whereby forming, on the semiconductor substrate, a plurality of element forming regions each including an active layer in the semiconductor layer; forming a plurality of semiconductor elements by forming electrodes on the element forming regions; and forming interconnects for electrically connecting the semiconductor elements to one another on the plurality of semiconductor elements.

In the second method for fabricating a semiconductor device, a plurality of element forming regions each including an active layer made of a group III-V nitride in the semiconductor layer are independently formed by forming a plurality of insulating isolation regions reaching the buried insulating layers. Therefore, even when the respective semiconductor elements are electrically connected to one another as an integrated circuit, a high voltage operation can be performed.

BRIEF DESCRIPTION OF THE DRAWINGS

FIGS. 1A and 1B are diagrams of a semiconductor device according to Embodiment 1 of the invention, wherein FIG. 1A is a plan view thereof and FIG. 1B is a cross-sectional view thereof taken along line Ib-Ib of FIG. 1A;

FIGS. 10A, 10B and 10C are cross-sectional views for showing other procedures in the method for fabricating the semiconductor device of Embodiment 2.

DETAILED DESCRIPTION OF THE INVENTION

Embodiment 1

Embodiment 1 of the invention will now be described with reference to the accompanying drawings.

Figure 1A:
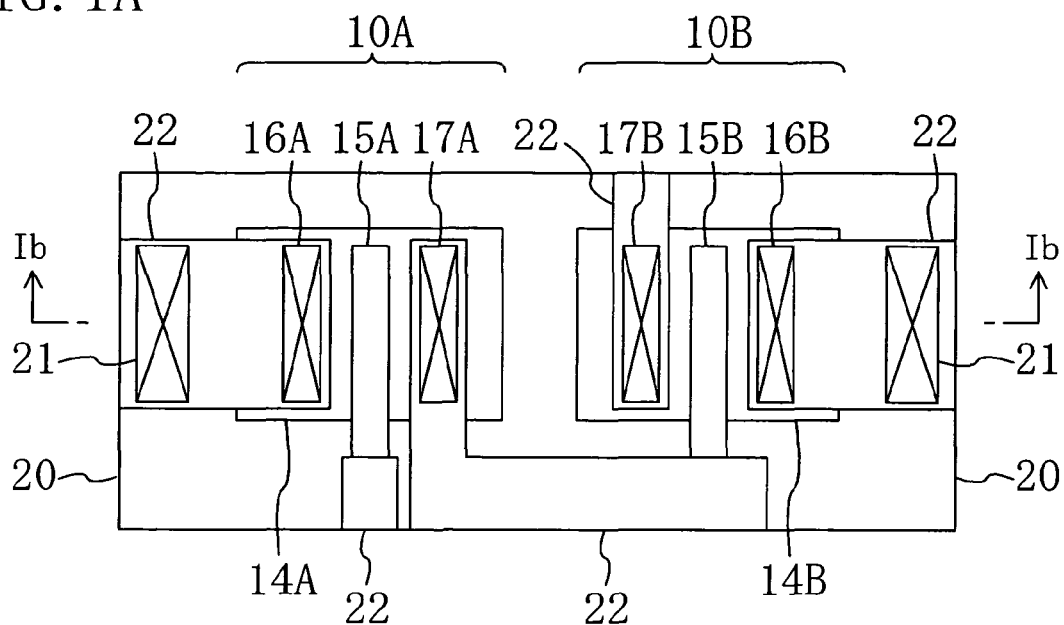
Figure 1B:
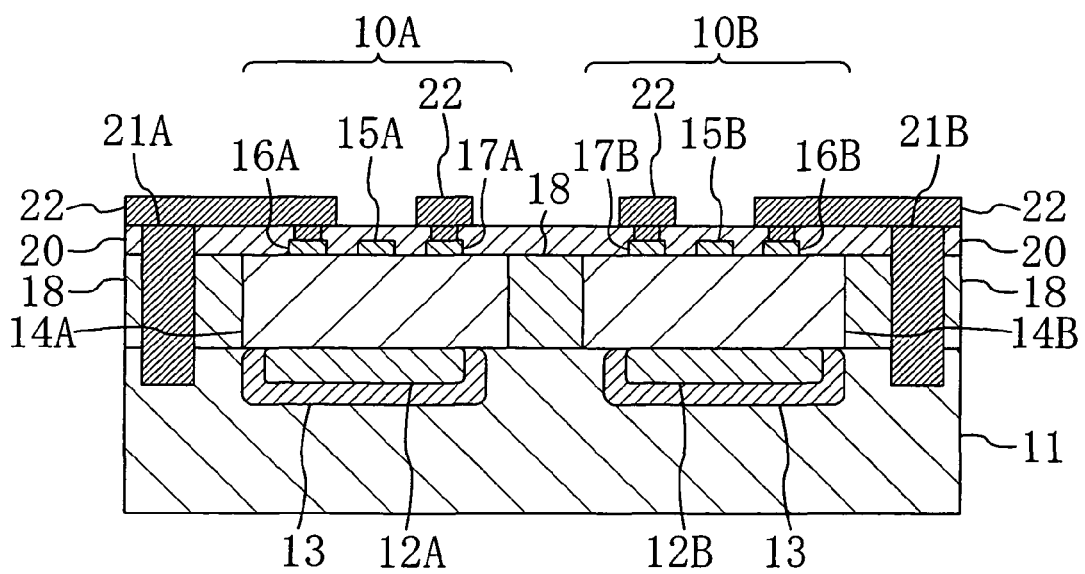

FIGS. 1A and 1B show a semiconductor device of Embodiment 1 in which two high power HFETs are integrated, and specifically, FIG. 1A is a plan view thereof and FIG. 1B is a cross-sectional view thereof taken on line Ib-Ib of FIG. 1A.

As shown in FIG. 1B, a first polarity inversion region 12A and a second polarity inversion region 12B both of p-type conductivity spaced from each other are selectively formed in an upper portion of a semiconductor substrate 11 of, for example, n-type silicon (Si). The bottoms and the side faces of the polarity inversion regions 12A and 12B are covered with a p-type low concentration impurity region 13 including a p-type impurity in a lower concentration than in the polarity inversion regions 12A and 12B. Since the p-type low concentration impurity region 13 is thus provided, a larger depletion layer extends in the semiconductor substrate 11 when a high voltage is applied to the semiconductor device, and hence, the breakdown voltage is increased by approximately 20% as compared with the case where the polarity inversion regions alone are provided.

As shown in FIGS. 1A and 1B, a first active layer 14A and a second active layer 14B in each of which a plurality of group III-V nitride semiconductor layers are stacked are formed respectively on the first polarity inversion region 12A and the second polarity inversion region 12B on the principal face of the semiconductor substrate 11.

Figure 2:
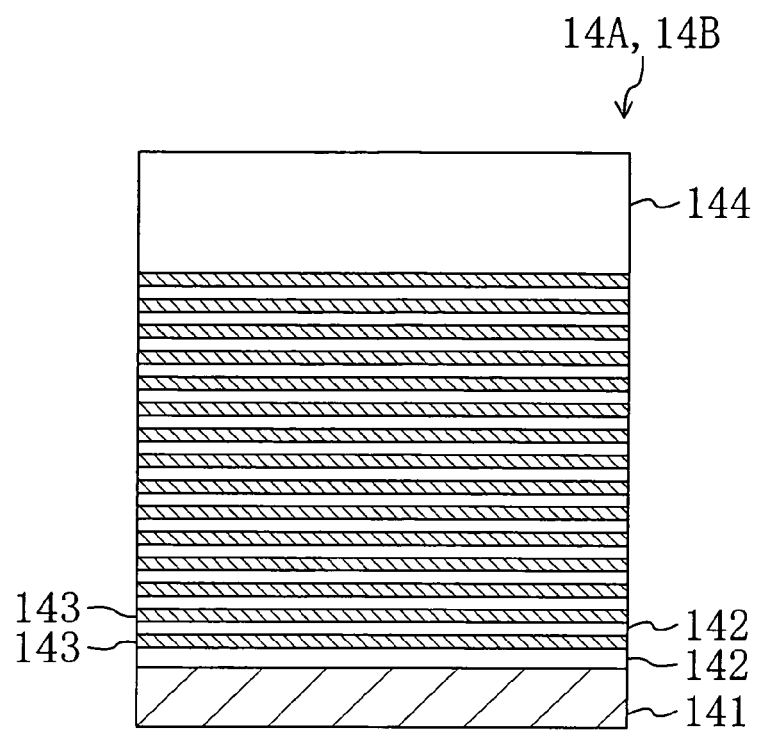
FIG. 2 is an enlarged cross-sectional view for showing the structure of an active layer of the semiconductor device of Embodiment 1.

At this point, the detailed structure of the first active layer 14A and the second active layer 14B is shown in FIG. 2. Each of the active layers 14A and 14B includes an initial buffer layer 141 of aluminum nitride (AlN) with a thickness of approximately 50 nm, a superlattice layer composed of fifteen gallium nitride (GaN) layers 142 and fifteen aluminum nitride (AlN) layers 143 each having a thickness of 25 nm and alternately stacked, and a channel layer 144 with a thickness of 1 μm, which are successively epitaxially grown from the substrate side. In this case, the superlattice layer guarantees a high breakdown voltage peculiar to GaN-based materials.

As shown in FIGS. 1A and 1B, a first gate electrode 15A, a first source electrode 16A and a first drain electrode 17A provided on the both sides of and spaced from the first gate electrode 15A are formed on the first active layer 14A, and a second gate electrode 15B, a second source electrode 16B and a second drain electrode 17B provided on the both sides of and spaced from the second gate electrode 15B are formed on the second active layer 14B. In this manner, a first HFET 10A including the first active layer 14A and a second HFET 10B including the second active layer 14B are constructed on the semiconductor substrate 11. In this embodiment, the first drain electrode 17A of the first HFET 10A and the second drain electrode 17B of the second HFET 10B are adjacent to each other.

An insulating isolation region 18 is formed around the HFETs 10A and 10B for insulating them from each other. The bottom of the isolation region 18 is placed at a level equivalent to the bottoms of the first active layer 14A and the second active layer 14B, and the HFETs 10A and 10B exhibit high isolation characteristics also within the semiconductor substrate 11.

An interlayer insulating film 20 of silicon nitride ($Si_3N_4$) with a thickness of, for example, 300 nm is formed on the isolation region 18 over the whole top face including the HFETs 10A and 10B. A first contact 21A penetrating through the interlayer insulating film 20 and the isolation region 18 to be connected to the semiconductor substrate 11 is formed in a portion of the interlayer insulating film 20 on a side of the first source electrode 16A. Also, a second contact 21B penetrating through the interlayer insulating film 20 and the isolation region 18 to be connected to the semiconductor substrate 11 is formed in a portion of the interlayer insulating film 20 on a side of the second source electrode 16B.

Interconnects 22 respectively for connecting the first contact 21A and the first source electrode 16A to each other, for connecting the first drain electrode 17A and the second gate electrode 15B to each other, for connecting the second contact 21B and the second source electrode 16B to each other, etc. are formed on the interlayer insulating film 20.

Figure 3:
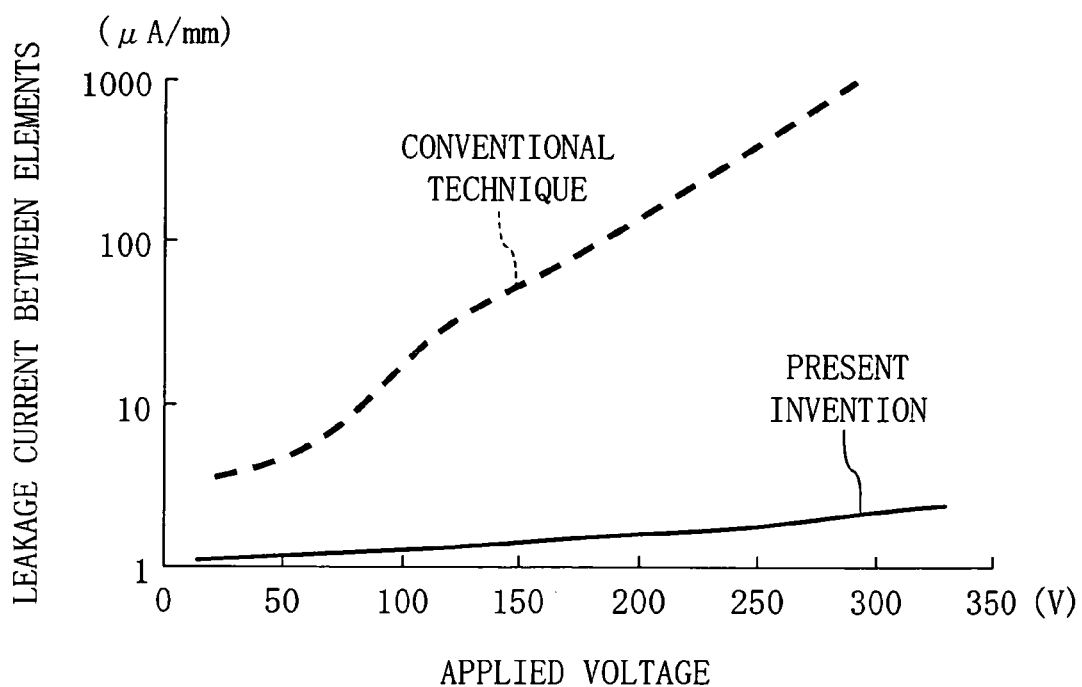
FIG. 3 is a characteristic diagram for showing the relationship between an applied voltage and a leakage current between elements of the semiconductor device of Embodiment 1 compared with that of a conventional semiconductor device.

FIG. 3 shows comparison of a leakage current caused between elements in the semiconductor device of Embodiment 1 and a conventional semiconductor device. In the semiconductor device of this embodiment, the leakage current is smaller by two or more figures than in the conventional semiconductor device under application of a high voltage of 300 V or more. Thus, a high breakdown voltage is realized in the present semiconductor device.

Now, a method for fabricating the semiconductor device having the aforementioned architecture will be described with reference to the accompanying drawings.

FIGS. 4A through 4C, 5A through 5C, 6A and 6B are cross-sectional views for showing procedures in the method for fabricating the semiconductor device of Embodiment 1.

Figure 4A:
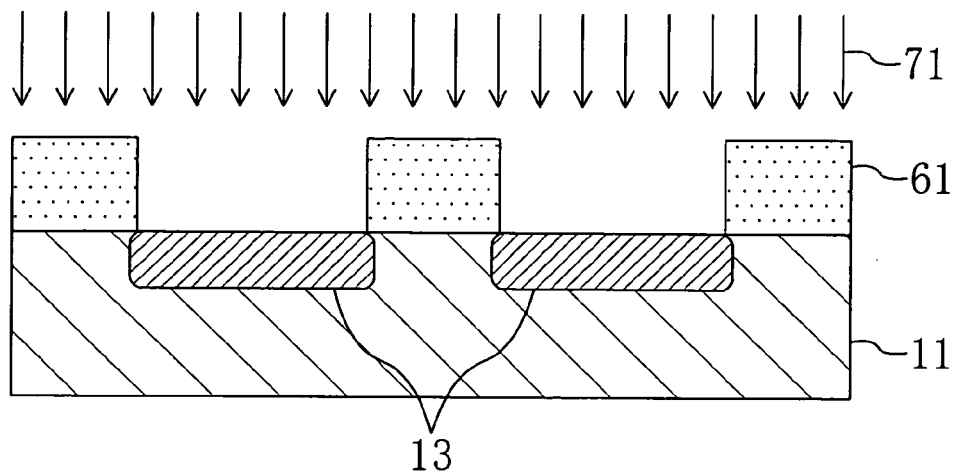
FIGS. 4A, 4B and 4C are cross-sectional views for showing procedures in a method for fabricating the semiconductor device of Embodiment 1.

First, as shown in FIG. 4A, a first resist film is applied on a semiconductor substrate 11 of n-type silicon, and thereafter, the first resist film is formed, by lithography, into a first resist pattern 61 having openings in a plurality of regions where p-type low concentration impurity regions are to be formed. Subsequently, by using the first resist pattern 61 as a mask, first ion beams 71 including boron (B) are ion implanted at acceleration energy of 50 keV and a dose of $1 \times 10^{12}$ cm$^{-2}$, thereby forming a plurality of p-type low concentration regions 13 in an upper portion of the semiconductor substrate 11.

Figure 4B:
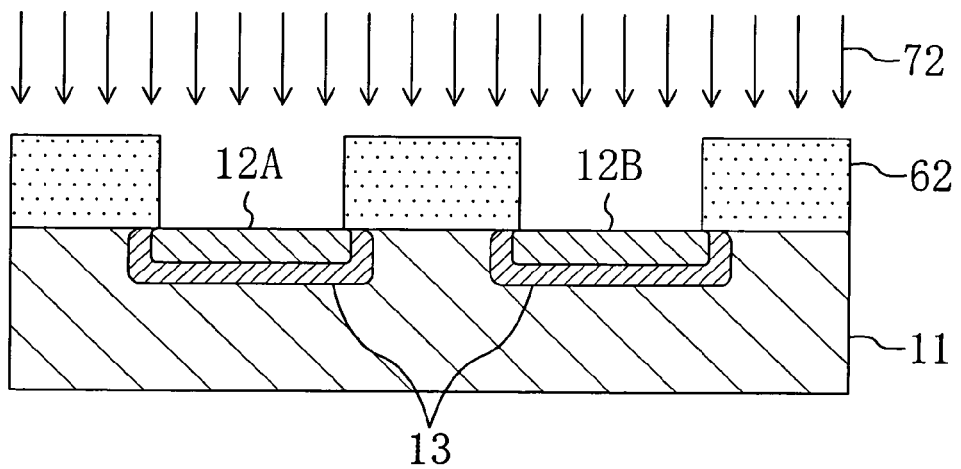

Next, as shown in FIG. 4B, after removing the first resist pattern 61, a second resist film is applied on the principal face of the semiconductor substrate 11. Subsequently, the second resist film is formed, by the lithography, into a second resist pattern 62 having openings in regions between the p-type low concentration impurity regions 13 on the principal face of the semiconductor substrate 11 where polarity inversion regions are to be formed. Thereafter, by using the second resist pattern 62 as a mask, second ion beams 72 including boron (B) are ion implanted at acceleration energy of 50 keV and a dose of $1 \times 10^{13}$ cm$^{-2}$, thereby forming a first polarity inversion region 12A and a second polarity inversion region 12B both of the p-type conductivity within the respective p-type low concentration impurity regions 13 in the semiconductor substrate 11.

Figure 4C:
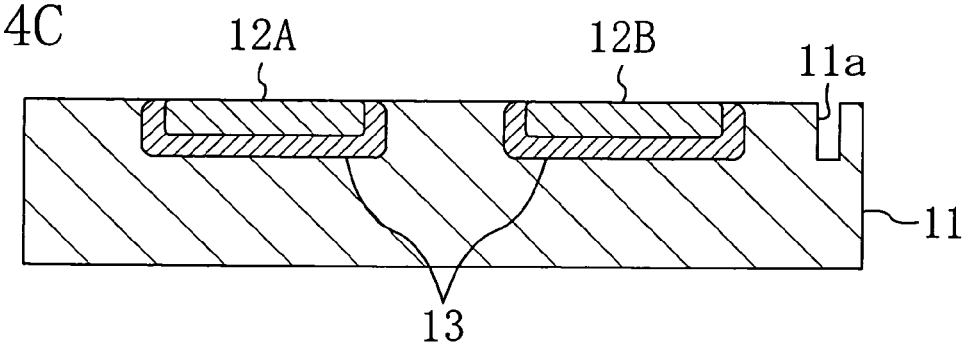

Then, as shown in FIG. 4C, after removing the second resist pattern 62, a concave mark 11a to be used as an alignment identifying mark in a subsequent exposure step of forming an active layer (element forming region) made of a GaN-based semiconductor layer is formed, by dry etching using an etching gas including chlorine (Cl$_2$) as a principal component, in a region on the principal face of the semiconductor substrate 11 where neither the polarity inversion regions 12A and 12B nor the p-type low concentration impurity regions 13 are formed. At this point, regions on the principal face of the substrate excluding the region where the mark 11a is to be formed are protected by covering with a third resist film (not shown) with a thickness of 2 through 3 μm.

Figure 5A:
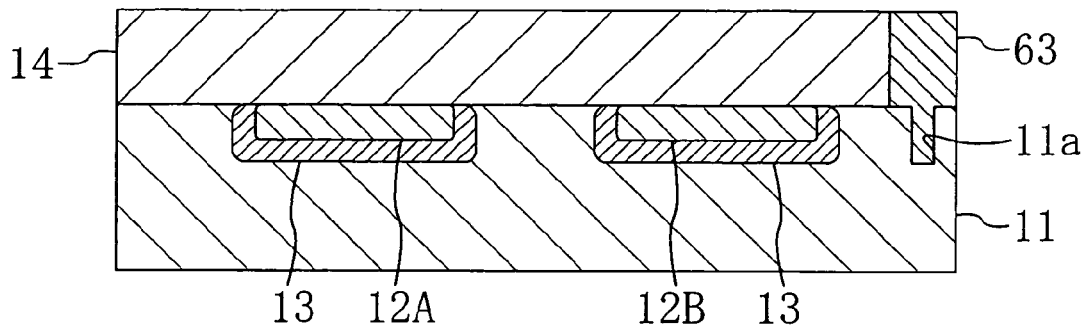
FIGS. 5A, 5B and 5C are cross-sectional views for showing other procedures in the method for fabricating the semiconductor device of Embodiment 1.

Next, as shown in FIG. 5A, by using the third resist mask as a mask, a protection film 63 of silicon oxide is deposited by chemical vapor deposition (CVD) so as to fill the mark 11a and to attain a thickness of approximately 2 μm on the mark 11a. Subsequently, after removing the third resist film, a semiconductor layer 14 of a group III-V nitride is epitaxially grown by metal organic chemical vapor deposition (MOCVD) on the semiconductor substrate 11 including the polarity inversion regions 12A and 12B and the p-type low concentration impurity regions 13.

Figure 5B:
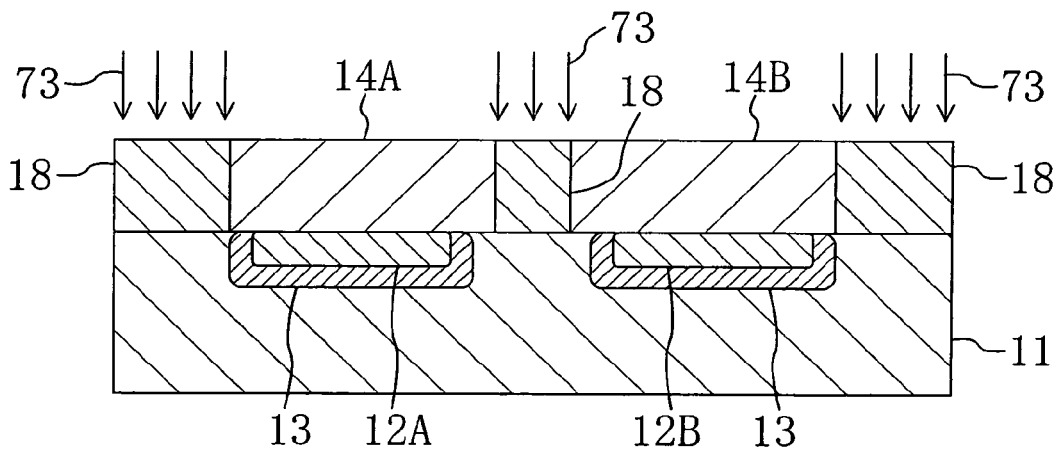

Then, as shown in FIG. 5B, after aligning a mask by using the mark 11a, third ion beams 73 including boron (B) are selectively ion implanted at acceleration energy of 500 keV and a dose of $1 \times 10^{14}$ cm$^{-2}$ into portions of the semiconductor layer 14 sandwiched between the p-type low concentration impurity regions 13 in the semiconductor substrate 11, thereby forming insulating isolation regions 18 in the portions of the semiconductor layer 14 sandwiched between the p-type low concentration impurity regions 13. Thus, a first active layer 14A and a second active layer 14B both made of the group III-V nitride are independently formed from the semiconductor layer 14 respectively on the polarity inversion regions 12A and 12B. It is noted that the mark Ha is not shown in FIG. 5B.

Figure 5C:
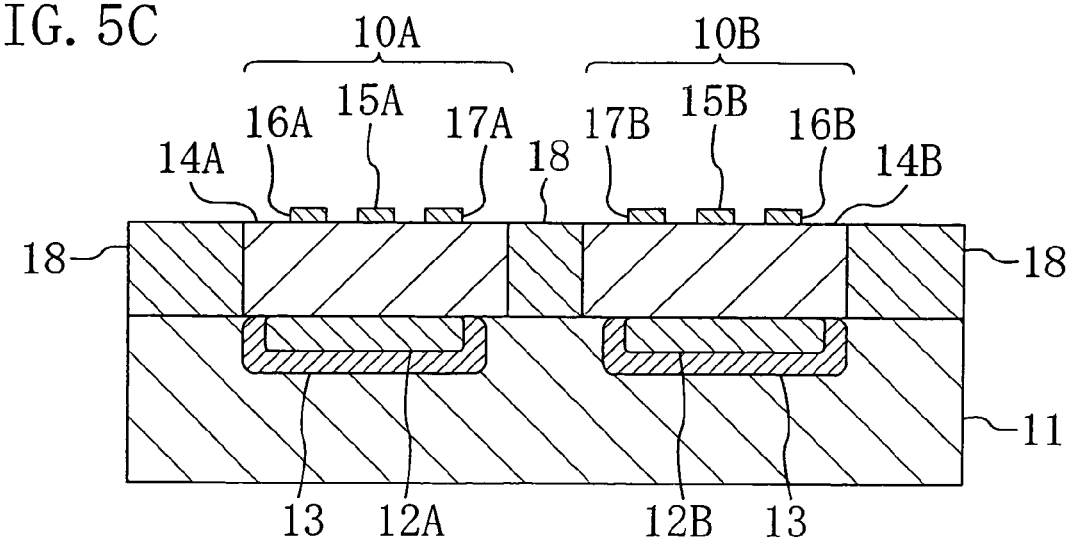

Next, as shown in FIG. 5C, a fourth resist pattern (not shown) having openings in regions where source electrodes and drain electrodes are to be formed is formed on the active layers 14A and 14B including the isolation regions 18 by the lithography. Thereafter, by using the fourth resist pattern as a mask, a first metal film of a multilayered body of titanium (Ti) and aluminum (Al) is deposited by, for example, vacuum deposition or sputtering. Then, a first source electrode 16A and a first drain electrode 17A, and a second source electrode 16B and a second drain electrode 17B all having an ohmic property are formed respectively on the first active layer 14A and the second active layer 14B by what is called a lift-off method for removing the fourth resist pattern. Subsequently, a fifth resist pattern (not shown) having openings in regions where gate electrodes are to be formed is formed on the active layers 14A and 14B including the isolation regions 18 by the lithography. Then, by using the fifth resist pattern as a mask, a second metal film of palladium (Pd) is deposited by, for example, the vacuum deposition. Thereafter, a first gate electrode 15A and a second gate electrode 15B both having a Schottky property are respectively formed on the first active layer 14A and the second active layer 14B by the lift-off method for removing the fifth resist pattern. Thus, a first HFET 10A including the first active layer 14A and a second HFET 10B including the second active layer 14B are formed.

Figure 6A:
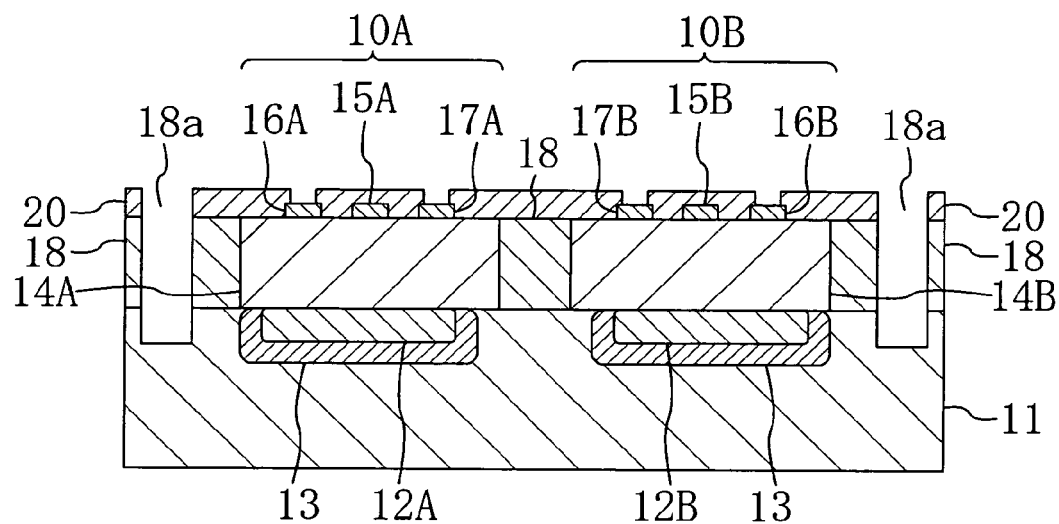
FIGS. 6A and 6B are cross-sectional views for showing other procedures in the method for fabricating the semiconductor device of Embodiment 1.

Next, as shown in FIG. 6A, an interlayer insulating film 20 of silicon nitride (Si$_3$N$_4$) with a thickness of 300 nm is deposited by the CVD so as to cover the first HFET 10A and the second HFET 10B. Subsequently, openings for exposing contact forming regions and connecting portions for connecting the gate electrodes 15A and 15B, the source electrodes 16A and 16B and the drain electrodes 17A and 17B to interconnects are formed in the interlayer insulating film 20 by the lithography and the dry etching using an etching gas including fluorocarbon as a principal component. Thereafter, contact holes 18a for forming substrate contacts of the HFETs 10A and 10B are formed in the isolation regions 18 so as to expose the semiconductor substrate 11 therein by the lithography and the dry etching using chlorine.

Figure 6B:
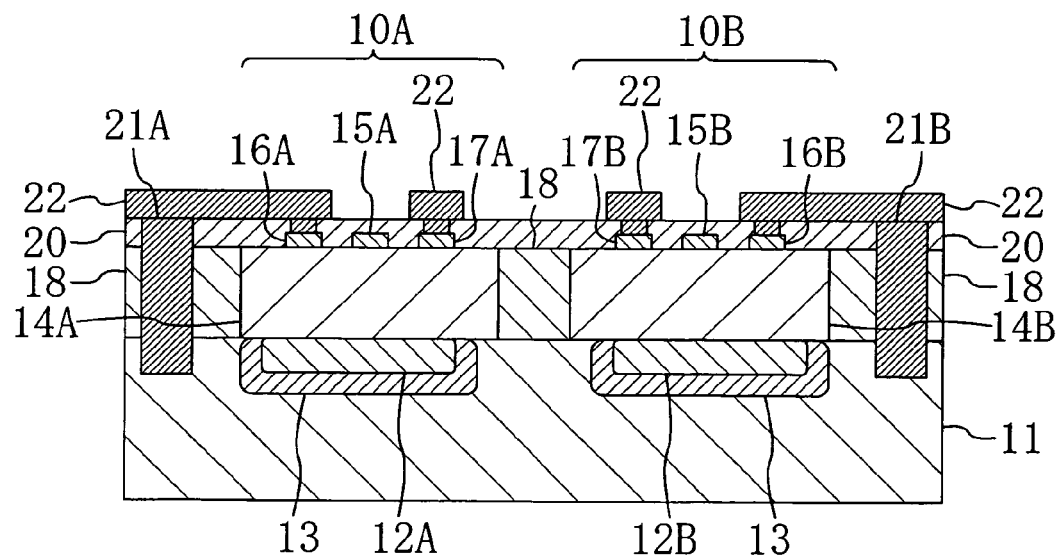

Then, as shown in FIG. 6B, a sixth resist pattern (not shown) for exposing the contact holes 18a, one ends of the gate electrodes 15A and 15B, the source electrodes 16A and 16B and the drain electrodes 17A and 17B is formed on the interlayer insulating film 20 by the lithography. Subsequently, by using the sixth resist pattern as a mask, a metal film of titanium (Ti) and gold (Au) for forming interconnects is deposited by a plating method, thereby forming contacts 21A and 21B and interconnects 22.

It is noted that the semiconductor substrate 11 may be a p-type semiconductor substrate instead of the n-type substrate.

Embodiment 2

Embodiment 2 of the invention will now be described with reference to the accompanying drawings.

Figure 7:
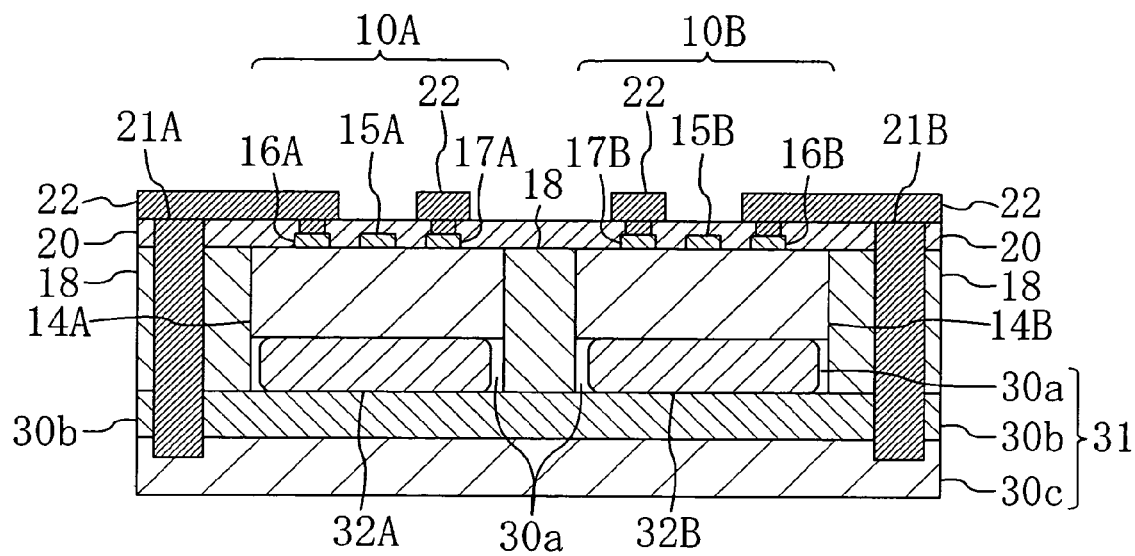
FIG. 7 is a cross-sectional view of a semiconductor device according to Embodiment 2 of the invention.

FIG. 7 is a cross-sectional view of a semiconductor device of Embodiment 2 in which two high power HFETs are integrated. The plan structure of this semiconductor device is similar to that of Embodiment 1 shown in FIG. 1B. Also, like reference numerals are used in FIG. 7 to refer like elements shown in FIG. 1 and the description is omitted.

In Embodiment 1, the semiconductor substrate 11 of n-type silicon is used as the substrate on which the group III-V nitride semiconductor layer 14 is epitaxially grown.

In contrast, an n-type SOI substrate 31 including an n-type upper silicon layer 30a, a buried oxide layer 30b and an n-type lower silicon layer 30c is used in Embodiment 2 as shown in FIG. 7.

Specifically, the SOI substrate 31 includes the n-type upper silicon layer 30a with a thickness of 0.2 μm, the buried oxide layer 30b of silicon oxide with a thickness of 100 nm formed under the n-type upper silicon layer 30a, and the n-type lower silicon layer 30c formed under the buried oxide layer 30b.

In the upper silicon layer 30a, a first p-type low concentration impurity region 32A and a second p-type low concentration impurity region 32B are formed respectively below a first HFET 10A and a second HFET 10B so as to be in contact with the buried oxide layer 30b.

In Embodiment 2, an isolation region 18 reaches the buried oxide layer 30b. Thus, the HFETs 10A and 10B exhibit high isolation characteristics also in the SOI substrate 31.

Each of a first contact 21A and a second contact 21B penetrates through the buried oxide layer 30b so as to reach the n-type lower silicon layer 30c.

It is noted that the lower end of the isolation region 18 may be placed at a level within the n-type upper silicon layer 30a of the SOI substrate 31 so as to allow the contacts 21A and 21B to be in contact with the n-type upper silicon layer 30a. Also in this case, the n-type upper silicon layer 30a attains potential equivalent to that of source electrodes 16A and 16B of the HFETs 10A and 10B so as to function as a field plate, and therefore, even when the HFETs 10A and 10B are electrically connected to each other, a high voltage operation can be performed.

Figure 8:
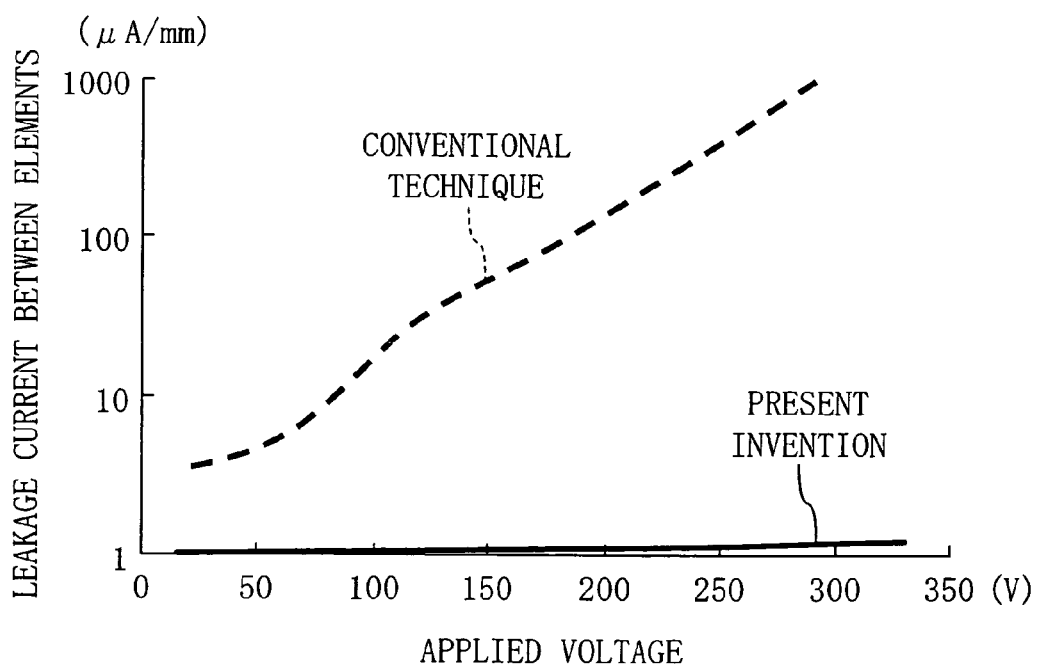
FIG. 8 is a characteristic diagram for showing the relationship between an applied voltage and a leakage current between elements of the semiconductor device of Embodiment 2 compared with that of a conventional semiconductor device.

FIG. 8 shows comparison of a leakage current caused between elements in the semiconductor device of Embodiment 2 and a conventional semiconductor device. In the semiconductor device of this embodiment, the leakage current is smaller by three or more figures than in the conventional semiconductor device under application of a high voltage of 300 V or more. Thus, a higher breakdown voltage is realized in the present semiconductor device.

Now, a method for fabricating the semiconductor device having the aforementioned architecture will be described with reference to the accompanying drawings.

FIGS. 9A through 9C and 10A through 10C are cross-sectional views for showing procedures in the method for fabricating the semiconductor device of Embodiment 2.

Figure 9A:
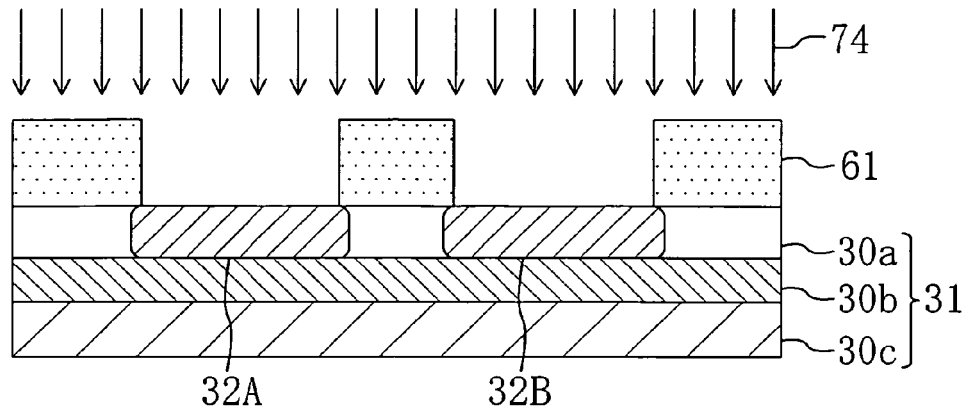
FIGS. 9A, 9B and 9C are cross-sectional views for showing procedures in a method for fabricating the semiconductor device of Embodiment 2.

First, as shown in FIG. 9A, a first resist film is applied on an n-type upper silicon layer 30a of a SOI substrate 31, and thereafter, the first resist film is formed, by the lithography, into a first resist pattern 61 having openings in a plurality of regions where p-type low concentration impurity regions are to be formed. Subsequently, by using the first resist pattern 61 as a mask, first ion beams 74 including boron (B) are ion implanted at acceleration energy of 50 keV and a dose of $1\times10^{12}$ cm$^{-2}$, thereby forming a plurality of p-type low concentration impurity regions 32 in the n-type upper silicon layer 30a. Although the p-type low concentration impurity regions 32 are not always necessary, they are preferably provided because the breakdown voltage of the semiconductor device is thus further increased.

Figure 9B:
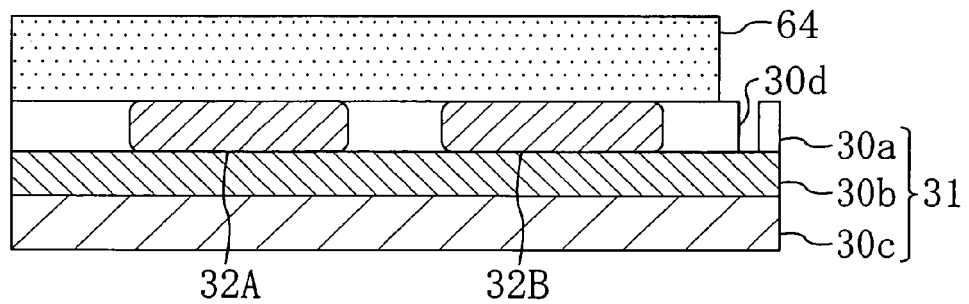

Next, as shown in FIG. 9B, after removing the first resist pattern 61, a second resist pattern 64 having openings for exposing regions on the principal face of the SOI substrate 31 where the p-type low concentration impurity regions 32A and 32B are not formed is formed by the lithography. Subsequently, by using the second resist pattern 64 as a mask, a hole-shaped mark 30d to be used as an alignment identifying mark in a subsequent exposure step of forming an active layer (element forming region) made of a GaN-based semiconductor layer is formed in the n-type upper silicon layer 30a by the dry etching using an etching gas including chlorine as a principal component.

Figure 9C:
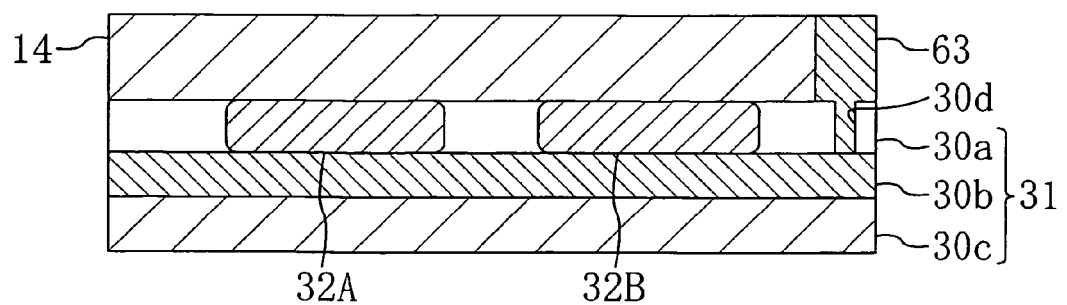
Figure 11:
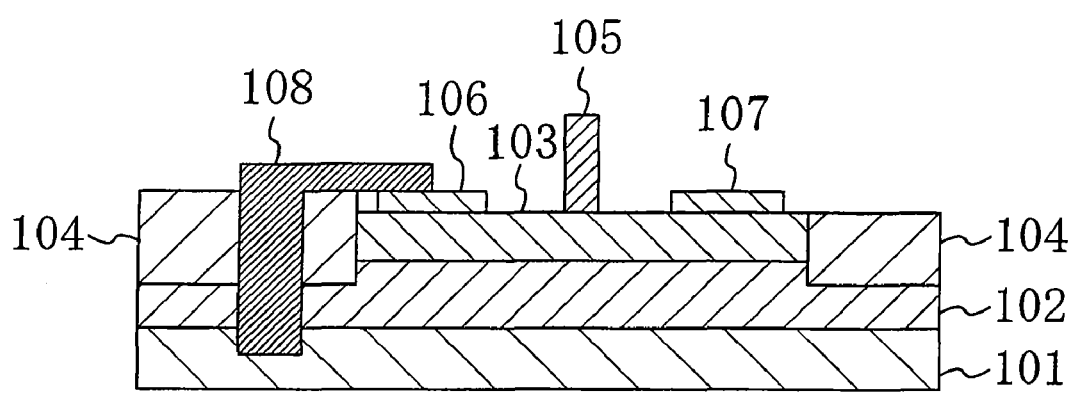
FIG. 11 is a cross-sectional view of a conventional semiconductor device (HFET) using a group III-V nitride semiconductor.

Then, as shown in FIG. 9C, by using the second resist pattern 64 as a mask, a protection film 63 of a silicon oxide is deposited by the CVD so as to fill the mark 30d and attain a thickness of approximately 2 μm on the mark 30d. Subsequently, after removing the second resist pattern 64, a semiconductor layer 14 of a group III-V nitride is epitaxially grown by the MOCVD on the n-type upper silicon layer 30a of the SOI substrate 31 including the p-type low concentration impurity regions 32A and 32B.

Next, as shown in FIG. 10A, after aligning a mask by using the mark 30d, second ion beams 75 including boron (B) are selectively ion implanted at acceleration energy of 500 keV and a dose of $1\times10^{14}$ cm$^{-2}$ into portions of the semiconductor layer 14 sandwiched between the p-type low concentration impurity regions 32A and 32B, thereby forming insulating isolation regions 18 in the portions of the semiconductor layer 14 sandwiched between the p-type low concentration impurity regions 32A and 32B. Thus, a first active layer 14A and a second active layer 14B both made of the group III-V nitride are independently formed from the semiconductor layer 14 respectively on the p-type low concentration impurity regions 32A and 32B. It is noted that the mark 30d is not shown in FIG. 10A.

Then, as shown in FIG. 10B, in the same manner as in Embodiment 1, a first source electrode 16A and a first drain electrode 17A, and a second source electrode 16B and a second drain electrode 17B all made of a multilayered body of titanium and aluminum are formed respectively on the first active layer 14A and the second active layer 14B by the lithography and the lift-off method. Subsequently, a first gate electrode 15A and a second gate electrode 15B both of palladium are formed respectively on the first active layer 14A and the second active layer 14B by the lithography and the lift-off method. Thus, a first HFET 10A including the first active layer 14A and a second HFET 10B including the second active layer 14B are formed.

Next, as shown in FIG. 10C, an interlayer insulating film 20 of silicon nitride with a thickness of 300 nm is deposited by the CVD so as to cover the first HFET 10A and the second HFET 10B. Then, openings for exposing contact forming regions and connecting portions for connecting the gate electrodes 15A and 15B, the source electrodes 16A and 16B and the drain electrodes 17A and 17B to interconnects are formed in the interlayer insulating film 20 by the lithography and the dry etching using an etching gas including fluorocarbon as a principal component. Thereafter, contact holes 18a for forming substrate contacts of the HFETs 10A and 10B are formed in the isolation regions 18 by the lithography and the dry etching using chlorine so as to expose the n-type lower silicon layer 30c of the SOI substrate 31 therein.

Then, the lithography and the plating method are executed for forming a first contact 21A and a second contact 21B and for forming, on the interlayer insulating film 20, interconnects 22 connected to one ends of the gate electrodes 15A and 15B, the source electrodes 16A and 16B and the drain electrodes 17A and 17B. Thus, the semiconductor device of FIG. 7 is completed.

It is noted that the SOI substrate 31 including the n-type layers may be replaced with a SOI substrate including p-type upper and lower silicon layers.

Further, in each of Embodiments 1 and 2 when at least the channel layer 144 and the GaN layer 142 as the supperlattice layers of the first active layer 14A and the second active layer 14B are n-type, a depletion layer is formed in the n-type layer within each active layer 14A, 14B because the polarity inversion regions 12A, 12B in the semiconductor substrate 11 are p-type, resulting in further reduction of the leakage current.

It is noted that in each of Embodiments 1 and 2, the supperlattice layers made of the GaN layer 142 and the AlN layer 143 are not necessarily formed in the active layers 14A, 14B, respectively. With no supperlattice layer provided, a pn junction is formed between the p-type polarity inversion regions 12A, 12B of the semiconductor substrate 11 if at least the channel layer 144 in each active region 14A, 14B is n-type, so that the depletion layer formed around the pn junction further expands even at application of higher positive voltage to each active layer 14A, 14B. Hence, the leakage current is suppressed, resulting in higher breakdown voltage.

As described so far, in the semiconductor device and the fabrication method for the same of this invention, a semiconductor device including a plurality of semiconductor elements all of which include independent active layers made of a group III-V nitride semiconductor and are electrically connected to one another can be integrated on a semiconductor substrate with a conducting property, and therefore, the invention is useful for a semiconductor device including high power elements or the like.

What is claimed is:

1. A semiconductor device comprising:
   a semiconductor substrate of a first conductivity type having, in an upper portion thereof, a plurality of polarity inversion regions spaced from one another and formed by introducing an impurity of a second conductivity type; and
   a plurality of semiconductor elements formed respectively on said polarity inversion regions, each of said plurality of semiconductor elements includes a buffer layer made of a nitride semiconductor, a channel layer made of a nitride semiconductor formed above said buffer layer, and source, drain and gate electrodes formed on said channel layer,
   wherein said buffer layers contact corresponding polarity inversion regions,
   said channel layers are spaced from each other,
   each of said polarity inversion regions forms a pn junction in said semiconductor substrate,
   said semiconductor elements are respectively formed on said semiconductor substrate in which said polarity inversion regions form the pn junction, and
   each of said polarity inversion regions overlaps at least a portion of each of a corresponding source, drain and gate electrode formed thereon.

2. The semiconductor device of claim 1,
   wherein each of said semiconductor elements has at least one terminal, and
   at least one of said semiconductor elements is electrically connected to said semiconductor substrate at said terminal.

3. The semiconductor device of claim 1,
   wherein the first conductivity type is n-type, the second conductivity type is p-type, and said channel layer includes an n-type layer.

4. The semiconductor device of claim 1,
   wherein a concentration of said impurity in each of said polarity inversion regions is lower in a peripheral portion thereof than in an inner portion thereof on a principal face of said semiconductor substrate.

5. The semiconductor device of claim 1, further comprising insulating isolation regions formed in said semiconductor substrate between said polarity inversion regions.

6. The semiconductor device of claim 1,
   wherein a mark for identifying a position of each of said polarity inversion regions is formed in said semiconductor substrate.

7. The semiconductor device of claim 6,
   wherein said mark is exposed on said semiconductor substrate.

8. The semiconductor device of claim 1, further comprising interconnects for electrically connecting said semiconductor elements to one another.

9. The semiconductor device of claim 1,
   wherein bottoms and side faces of said polarity inversion regions are covered with a low concentration impurity region including an impurity of a second type in a lower concentration than in the polarity inversion regions.

10. The semiconductor device of claim 1, wherein at least a side surface of each of said polarity inversion regions forms the pn junction in said semiconductor substrate.

11. The semiconductor device of claim 1, wherein the source electrodes are physically spaced from a corresponding polarity inversion region.

12. The semiconductor device of claim 1, wherein said semiconductor substrate surrounds a side surface of each of said polarity inversion regions.

13. A semiconductor device comprising:
   a semiconductor substrate of a first conductivity type having, in an upper portion thereof, a plurality of second conductivity type regions spaced from one another and formed by introducing an impurity of a second conductivity type; and
   a plurality of semiconductor elements formed respectively on said second conductivity type regions, each of said plurality of semiconductor elements includes a buffer layer made of a nitride semiconductor, a channel layer made of a nitride semiconductor formed above said buffer layer, and source, drain and gate electrodes formed on said channel layer,
   wherein said buffer layers contact corresponding second conductivity type regions,
   said channel layers are spaced from each other,
   each of said second conductivity type regions forms a pn junction in said semiconductor substrate,
   said semiconductor elements are respectively formed on the semiconductor substrate in which said second conductivity type regions form the pn junction, and
   each of said second conductivity type regions overlaps at least a portion of each of a corresponding source, drain and gate electrode formed thereon.

14. The semiconductor device of claim 13,
   wherein each of said semiconductor elements has at least one terminal, and
   at least one of said semiconductor elements is electrically connected to said semiconductor substrate at said terminal.

15. The semiconductor device of claim 13,
   wherein the first conductivity type is n-type, the second conductivity type is p-type, and said channel layer includes an n-type layer.

16. The semiconductor device of claim 13,
   wherein a concentration of said impurity in each of said second conductivity type regions is lower in a peripheral portion thereof than in an inner portion thereof on a principal face of said semiconductor substrate.

17. The semiconductor device of claim 13, further comprising insulating isolation regions formed in said semiconductor substrate between said second conductivity type regions.

18. The semiconductor device of claim 13, wherein a mark for identifying a position of each of said second conductivity type regions is formed in said semiconductor substrate.

19. The semiconductor device of claim 18, wherein said mark is exposed on said semiconductor substrate.

20. The semiconductor device of claim 13, further comprising interconnects for electrically connecting said semiconductor element to one another.

21. The semiconductor device of claim 13, wherein bottoms and side faces of said second conductivity type regions are covered with a low concentration impurity region including an impurity of a second type in a lower concentration than in said second conductivity type regions.

22. The semiconductor device of claim 13, wherein at least a side surface of each of said second conductivity type regions forms the pn junction in said semiconductor substrate.

23. The semiconductor device of claim 13, wherein the source electrodes are physically spaced from a corresponding second conductivity type region.

24. The semiconductor device of claim 13, wherein said semiconductor substrate surrounds a side surface of each of said second conductivity type regions.

* * * * *